US009507893B2

(12) United States Patent
Blain et al.

(10) Patent No.: US 9,507,893 B2
(45) Date of Patent: *Nov. 29, 2016

(54) TOOL FOR RAPID CONFIGURATION OF A RIVER MODEL USING IMAGERY-BASED INFORMATION

(71) Applicants: Cheryl Ann Blain, Slidell, LA (US); Robert S. Linzell, Carriere, MS (US); Alan D. Weidemann, Carriere, MS (US); Paul E. Lyon, Slidell, LA (US)

(72) Inventors: Cheryl Ann Blain, Slidell, LA (US); Robert S. Linzell, Carriere, MS (US); Alan D. Weidemann, Carriere, MS (US); Paul E. Lyon, Slidell, LA (US)

(73) Assignee: The United States of America, as represented by the Secretary of the Navy, Arlington, VA (US)

( * ) Notice: Subject to any disclaimer, the term of this patent is extended or adjusted under 35 U.S.C. 154(b) by 456 days.

This patent is subject to a terminal disclaimer.

(21) Appl. No.: 14/042,081

(22) Filed: Sep. 30, 2013

(65) Prior Publication Data
US 2014/0032191 A1 Jan. 30, 2014

Related U.S. Application Data

(63) Continuation of application No. 12/911,922, filed on Oct. 26, 2010, now Pat. No. 8,676,555.

(51) Int. Cl.
G06G 7/50 (2006.01)
G06G 7/48 (2006.01)
G06F 17/50 (2006.01)

(52) U.S. Cl.
CPC ....... *G06F 17/5018* (2013.01); *G06F 17/5009* (2013.01)

(58) Field of Classification Search
CPC ........... G06F 17/5018; G06F 17/5009; G06F 17/5004; G06F 17/50; A63F 2300/663; F15B 19/007
USPC ......................................................... 703/9, 6
See application file for complete search history.

(56) References Cited

U.S. PATENT DOCUMENTS

| 5,790,434 A | 8/1998 | Sutton |
| 2008/0195362 A1 | 8/2008 | Belcher |
| 2010/0131575 A1 | 5/2010 | Blain |
| 2011/0013841 A1 | 1/2011 | Weidemann |
| 2012/0101795 A1 | 4/2012 | Blain |

OTHER PUBLICATIONS

Blain, Cheryl Ann et al., "A Tool for Rapid Configuration of a River Model", 2009, MTS.*
McKay, Paul et al., "Toward Developing a Hydrodynamic Flow and Inundation Model of the Lower Pearl River", 2009, MTS.*
Blain, Cheryl Ann et al., "MeshGUI: A Mesh Generation and Editing Toolset for the ADCIRC Model", Feb. 8, 2008, Naval Research Laboratory.*
Blain, Cheryl Ann et al., "A Simple Methodology for Deriving Continuous River Shorelines from Imagery", Mar. 3, 2010.*

(Continued)

*Primary Examiner* — Cedric D Johnson
(74) *Attorney, Agent, or Firm* — US Naval Research Laboratory; Scott G. Bell

(57) ABSTRACT

System and method for extraction and processing of river bank coordinates from imagery, generation of an unstructured mesh of the river using river bank positions and available or synthetic bathymetry, application of upstream and downstream boundary forcing data, contingencies for handling missing data, and configuration of multiple realizations of the developed river model.

17 Claims, 15 Drawing Sheets

(56) References Cited

OTHER PUBLICATIONS

Blain, C.A. et al., "Influence of Domain Size and Grid Structure on the Response Characteristics of a Hurricane Storm Surge Model", Mar. 1995, U.S. Army Corps of Engineers.*

McAllister, Michael et al., "Medial Axis Generalization of River Networks", 2000.*

Jacobson, Robert B. et al., "Flow and Form in Rehabilitation of Large-River Ecosystems: An Example from the Lower Missouri River", Feb. 28, 2006, Elsevier B.V.*

Wang, Qing, "Finite Element Modeling of Tides and Currents of the Pascagoula River", 2008, Department of Civil, Environmental and Construction Engineering, University of Central Florida.*

Karadogan, E. et al., "Numerical Modeling of the Lower Mississippi River—Influence of Forcings on Flow Distribution and Impact of Sea Level Rise on the System", 2009, MTS.*

Blain, Cheryl Ann, et al, A Tool for Rapid Configuration of a River Model, MTS/IEEE Oceans '09, Slide Show, Oct. 28, 2009.

Seim, H., et al, Tidal circulation and energy dissipation in a shallow, sinuous estuary, Ocean Dynamics, Mar. 24, 2006.

Blanton, J. , Energy dissipation in a tidal estuary, Journal of Geophysical Research, vol. 74, No. 23, pp. 5460-5466, Oct. 20, 1969.

Blanton, B.O., Werner, F.E., Seim, H.E., Luettich, Jr., R. A., Lynch, D.R., Smith, K.W., Voulgaris, G., Bingham, F. M., Way, F., Barotropic tides in the South Atlantic Bight Journal of Geophysical Research, vol. 109, C12024, pp. 1-17, Dec. 21, 2004.

Taylor, G.I., Tidal friction in the Irish Sea, Philosophical Transactions of the Royal Society of London, vol. CCXX, pp. 1-33, Nov. 29, 1919.

Le Blond, P.H., Mysak, L.A., Waves in the Ocean, vol. 20, Elsevier Oceanography Series, pp. 454, 1980.

Blain, C. A., Linzell, R. S., Makef15: An ADCIRC Model Fort.15 Input File Creation GUI for Parameter Specification and Periodic Boundary Forcing, Naval Research Laboratory, Stennis Space Center, MS, NRL/MR/7320--07-9081, Dec. 7, 2007.

Blain, C. A., Linzell, R. S., Estrade, B., Makef22: An ADCIRC Model Fort.22 Input File Creation Tool for Surface Wind and Pressure Forcing, Naval Research Laboratory, Stennis Space Center, MS, NRL/MR/7320--07-9082, Dec. 7, 2007.

Blain, C. A., Linzell, R. S., Massey, T. C., MeshGUI: A Mesh Generation and Editing Toolset for the ADCIRC Model, Naval Research Laboratory, Stennis Space Center, MS, NRL/MR/7322--08-9083, Feb. 8, 2008.

Blain, C. A., Linzell, R. S., Weidemann, A.D., Lyon, P.E., A Tool for Rapid Configuration of a River Model, MTS/IEEE Oceans '09, D-933957-38-1 MTS, Oct. 26-29, 2009.

McKay, Paul, Blain, C.A., Toward Developing a Hydrodynamic Flow and Inundation Model for the Lower Pearl River, MTS, 2009 (Notice of References Cited for U.S. Appl. No. 12/911,922).

Blain, C. A., Linzell, R. Cobb., C. M., Weidemann, A. , A Simple Methodology for Deriving Continuous River Shorelines from Imagery,, pp. 1-32, Mar. 3, 2010 (Notice of References Cited for U.S. Appl. No. 12/911,922).

Jacobson, R. B., Galat, D. L., Flow and Form in Rehabilitation of Large-River Ecosystems: An Example from the Lower Missouri River, Gemorphology vol. 77, pp. 249-269, Feb. 28, 2006 (Notice of References Cited for U.S. Appl. No. 12/911,922).

McAllister, M, Snoeyink, J., Medial Axis Generation of River Networks, Cartography and Geographic Information Science, pp. 1-11, 2000 (Notice of References Cited for U.S. Appl. No. 12/911,922).

Office Action, Non-Final Rejection, U.S. Appl. No. 12/911,922, Tool for Rapid Configuration of a River Model Using Imagery-Based Information,filed Oct. 26, 2010, Cheryl Ann Blain, et al, mail date Jan. 30, 2013.

Notice of Allowance, U.S. Appl. No. 12/911,922, Tool for Rapid Configuration of a River Model Using Imagery-Based Information,filed Oct. 26, 2010, Cheryl Ann Blain, et al, mail date Jul. 16, 2013.

* cited by examiner

TO FIG. 4B

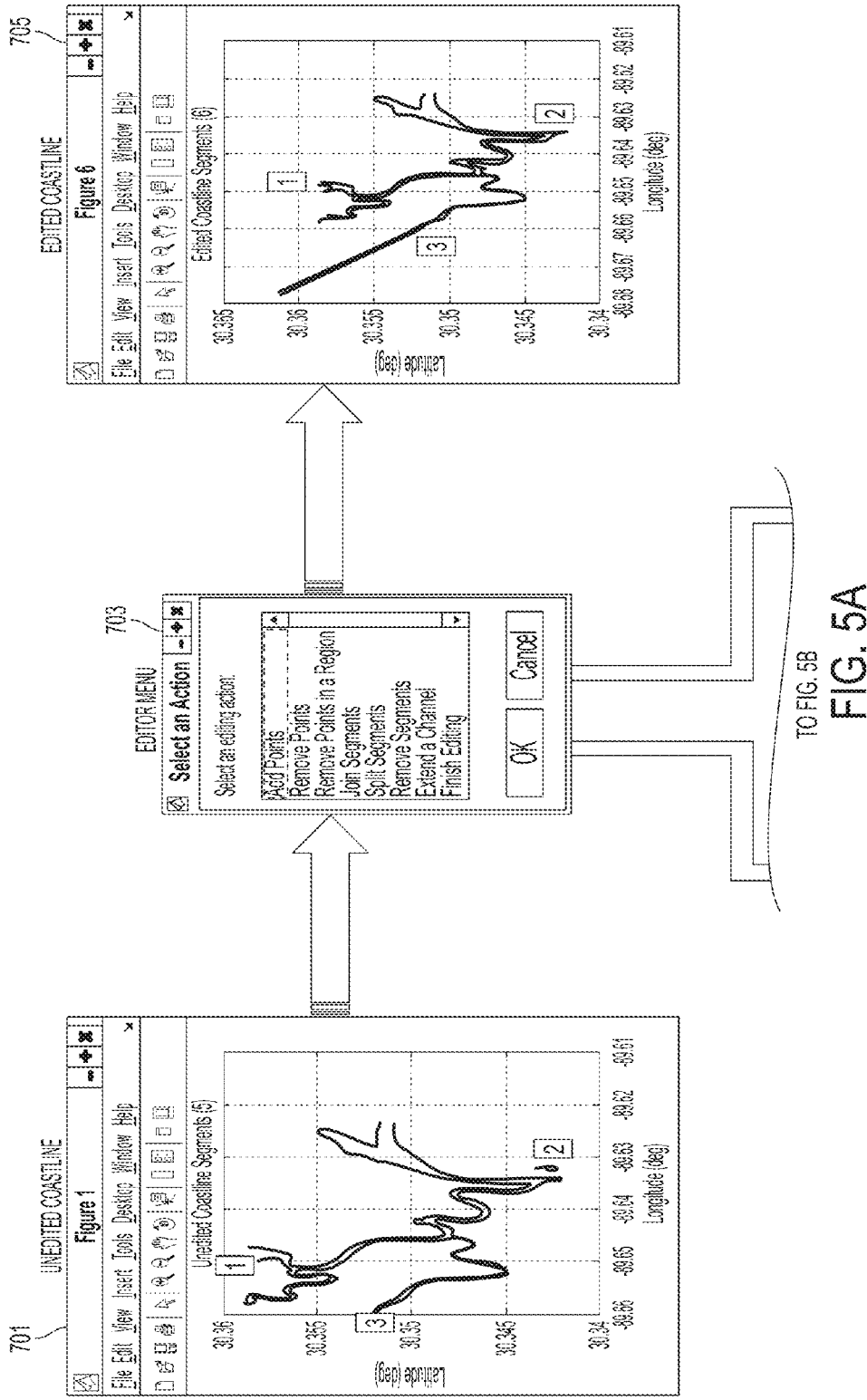

FIG. 5B

TOOL FOR RAPID CONFIGURATION OF A RIVER MODEL USING IMAGERY-BASED INFORMATION

CROSS-REFERENCE TO RELATED APPLICATIONS

This Application is a continuation application of U.S. patent application Ser. No. 12/911,922, entitled A TOOL FOR RAPID CONFIGURATION OF A RIVER MODEL USING IMAGERY-BASED INFORMATION, filed on Oct. 26, 2010, the entire disclosure of which is incorporated herein by reference.

BACKGROUND

Methods and systems disclosed herein relate generally to automated construction of a digital river model. In particular, the methods and systems of the present teachings relate to automated configuration of a digital river model based on imagery-extracted information that defines model geometry and water depth, as available.

Rivers pose one of the most challenging environments to characterize as they form the interface between land and water in the coastal margin. Rivers are geometrically complex and are continually changing in position and character. Predictive models of the river environment require detailed descriptions of the river bank position, bed elevation, upstream fluxes and downstream variability due to tidal modulations.

What are needed are a system and method to address the need for a predictive capability for currents and water level in rivers in regions where knowledge of the region is limited.

SUMMARY

To address the above-stated needs, an approach is devised that initiates a digital river model from available imagery and provides contingencies for missing data. The system of the present teachings can include, but is not limited to including, river cross-section creation, synthetic bathymetry calculations, alignment of mismatched coastline segment ends, closing of open coastline segment ends, specification of boundary forcing nodes, specification of boundary forcing, a channel extension process, a coastline editor, an input file generator, and creation of ensembles of model input data files for model evaluation. The automated configuration is also based on an unstructured mesh of linear triangles, automated image processing to produce edge and water data that is integrated with the shoreline and mesh generation process, automated closure of open ended shoreline segments, automated identification of end-member (boundary) segments to which forcing is applied, contingencies for the construction of bathymetry where none is available, default forcing and bottom type specification, an option for ensemble member construction if desired, and a graphical display that visualizes and aids the user at each required configuration step. An illustrative embodiment can include the 1) extraction and processing of river bank coordinates from imagery, 2) generation of an unstructured mesh of the river using river bank positions and available or synthetic bathymetry, 3) application of upstream and downstream boundary forcing data, 4) contingencies for handling missing data, and 5) an interface to configure multiple realizations of the developed river model.

BRIEF DESCRIPTION OF THE DRAWINGS

FIGS. 5A-5B are a set of charts depicting the graphical user interface (GUI) for coastline editing of the exemplary embodiment of the present teachings;

DETAILED DESCRIPTION

The problems set forth above as well as further and other problems are solved by the present teachings. These solutions and other advantages are achieved by the various embodiments of the teachings described herein below.

Figure 1:
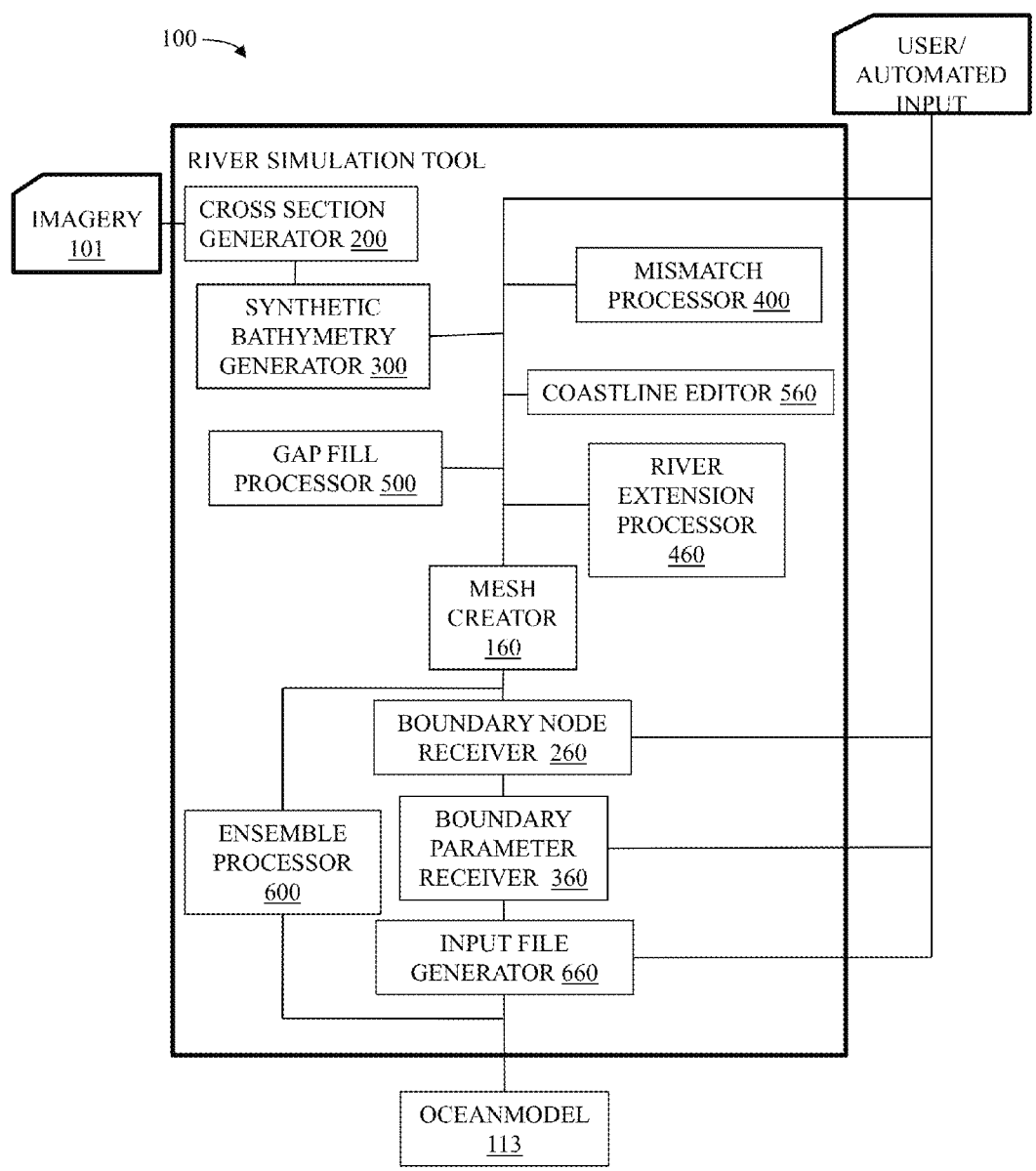
FIG. 1 is a schematic block diagram of the system for simulating river data of the present teachings.

Referring now to FIG. 1, system 100 for river simulation can include, but is not limited to including, cross section generator 200, synthetic bathymetry generator 300, mismatch processor 400, gap fill processor 500, boundary node receiver 260, boundary parameter receiver 360, river extension processor 460, mesh creator 160, coastline editor 560, and ensemble processor 600, which collectively prepare data for input file generator 660, and ultimately for ocean model 113.

Referring again to FIG. 1, one step in initiating a river model from available imagery is creating idealized river bathymetry. Cross section generator 200 can generate cross sections that span the width of the river banks. Because the river boundaries can be generated from remotely sensed imagery as opposed to a known centerline, cross section generator 200 can create cross sections that span the river and that are nearly perpendicular to both banks. Because each bank segment has a different number of segment points, cross sections cannot be easily constructed by simply connecting opposing segments. Cross sections can be constructed by determining the connections between the two-point segments (at their respective midpoints) of the larger river bank coastline segments. To create cross sections, the method of cross section generator 200 can include, but is not limited to including, the steps of determining the midpoints (or several sub-sections) of each two-point segment in the larger coastline segment, and determining the nearest midpoint location to the current midpoint location within a user-specified angle range (i.e. within 5 to 40 degrees of 90 degrees) to the current segment. This angular range is directed in the direction of the river. The method can further include the steps of checking for intersections of cross sections between two different coastline segments, checking for intersections of cross sections when a segment self-connects (connects to itself), restricting the angle for self-connections so that cross sections are across the banks of the river and not to the nearest neighbors, and checking for intersections involving three different coastline segments.

Figure 1A:
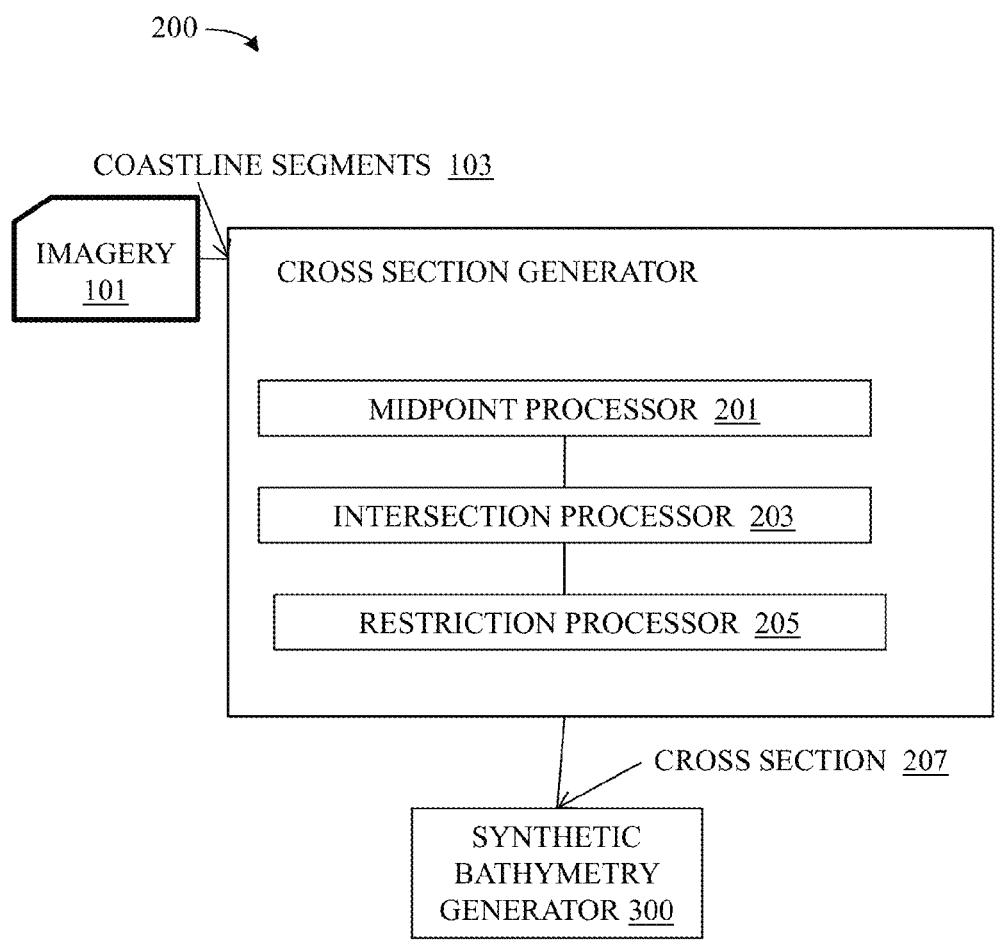
FIG. 1A is a schematic block diagram of the cross section generator.

Referring now to FIG. 1A, cross section generator 200 can include, but is not limited to including, midpoint processor 201 for determining the midpoints (or several sub-sections) of each two-point segment in the larger coastline segment derived from imagery 101, and determining the nearest midpoint location to the current midpoint location within a user-specified angle range (i.e. within 5 to 40 degrees of 90 degrees) to the current segment. This angular range is directed in the direction of the river. Cross section generator 200 can further include intersection processor 203 for checking for intersections of cross sections between two different coastline segments, and checking for intersections of cross sections when a segment self-connects (connects to itself), and checking for intersections involving three different coastline segments. Cross section generator 200 can still further include restriction processor 205 for restricting the angle for self-connections so that cross sections are across the banks of the river and not to the nearest neighbors. Cross section generator 200 can provide cross section 207 determined by its components to synthetic bathymetry processor 300.

Continuing to refer to FIG. 1, knowing the width of the cross sections can make it possible to assign idealized, synthetic bathymetry to the river channel. Assuming the maximum channel depth is proportional to the width of the channel, a parabolic or cube root functional bathymetry can be created that varies spatially over the river domain. This assumption can lead to the realistic condition in which wider river stretches are deeper at the center than narrower stretches. The method of synthetic bathymetry generator 300 can loop over cross sections, calculate the distance from a pre-selected known point, and apply the calculated functional depth value at a set of equidistant points along each cross section. In particular, the method can loop over all river cross sections, and at the current cross section, the method can divide the cross section into two halves. For each half cross section, ten equidistant points can be located along that half. At each of the ten points, the distance to a known point can be calculated. If the parabolic method is chosen, the known point is the center of the present cross section. If the cube root method is chosen, the known point is the coastline end of the present half cross section. At each of the ten points, the parabolic or cube root depth function is applied based on the distance previously calculated. The duplicate point from one of the halves, at the center of the present cross section, is eliminated.

Figure 1B:
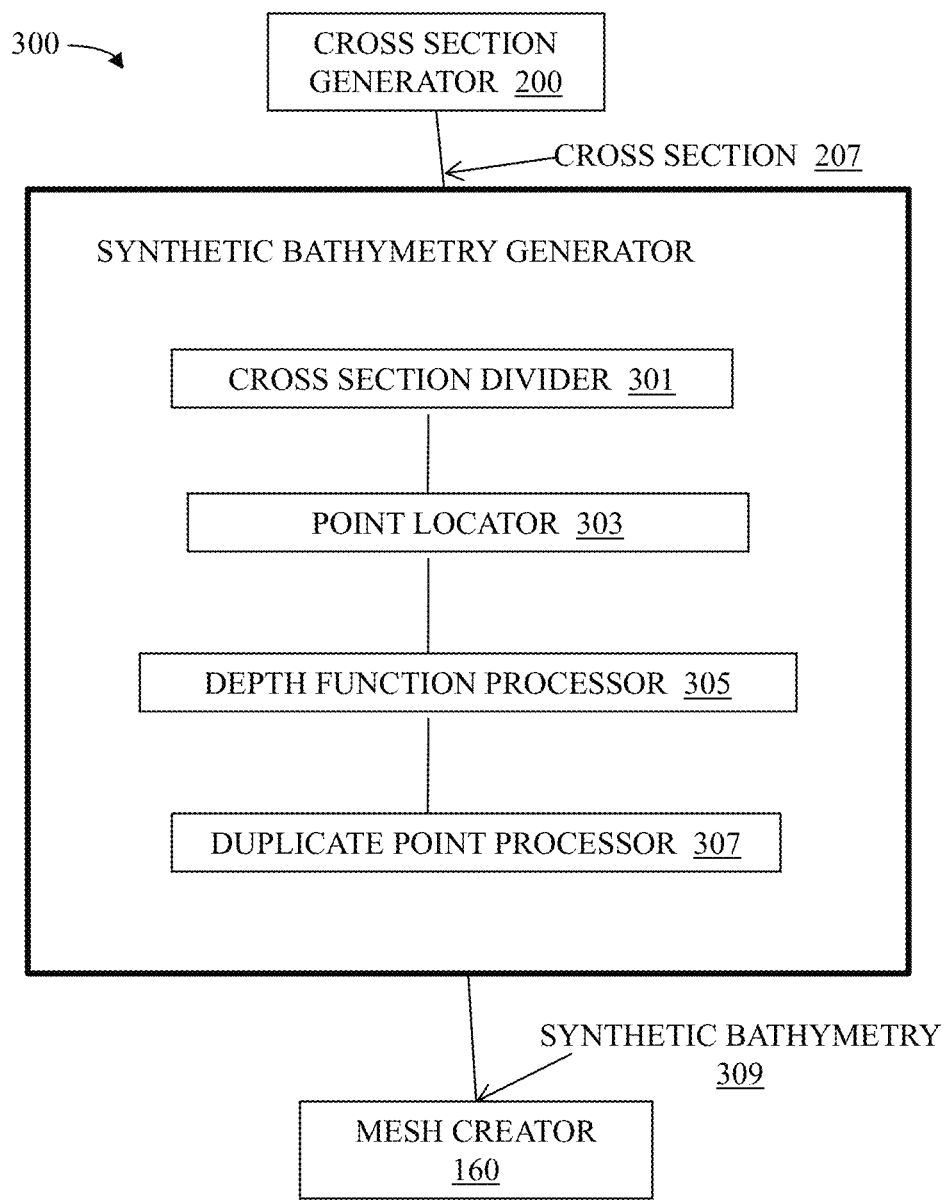
FIG. 1B is a schematic block diagram of the synthetic bathymetry generator.

Referring now to FIG. 1B, synthetic bathymetry generator 300 can include, but is not limited to including, cross section divider 301 for looping over cross sections 207, calculating the distance from a pre-selected known point, and applying the calculated functional depth value at a set of equidistant points along each cross section 207. In particular, cross section divider 301 can loop over all river cross sections 207, and at the current cross section 207, the cross section divider 301 can divide cross section 207 into two halves. For each half cross section, point locator 303 can locate ten equidistant points along that half. At each of the ten points, point locator 303 can calculate the distance to a known point. Depth function processor 305 can compute the depth according to, for example, but not limited to, a parabolic method or a cube root method. If the parabolic method is chosen, depth function processor 305 can compute a known point as the center of the present cross section. If the cube root method is chosen, depth function processor 305 can compute the known point as the coastline end of the present half cross section. At each of the ten points, depth function processor 305 can apply, for example, the parabolic or cube root depth function based on the distance previously calculated. Duplicate point processor 307 can eliminate the duplicate point from one of the halves, at the center of the present cross section. Synthetic bathymetry generator 300 can provide synthetic bathymetry 309 as calculated by the previously-described components to mesh creator 160.

Continuing to refer to FIG. 1, when processing arbitrary imagery to extract coastline position data, portions of a river may extend outside of the imagery. It is possible that one shore of a river could therefore be partially obscured or absent, so that the resulting coastline data have mismatched segment ends. Another step in initiating a river model from available imagery is to process the mismatches to correctly construct a finite element mesh in which the elements of the mesh do not cross or overlap, and boundaries do not cross or create artificial loops. Mismatch processor 400 can process mismatched segment ends by looping over all coastline segments, identifying the matching starts and ends of each segment and the next, locating the point at which an end is excessively distant from its nearest neighbor segment end, and removing a portion of the mismatched end to match its neighbor as closely as possible. In particular, the method of mismatch processor 400 can loop over all coastline segments. For each pair that includes the end of the present segment and the start of the next segment, the method of mismatch processor 400 can determine the distance between these two points and the end points of the nearest cross section, can identify any distances found in the previous steps that exceed the mean cross section length, and can loop over any excessive distances identified in the previous steps. For each pair of segment end and start, the method of mismatch processor 400 can remove points from that segment with the start or end that was found in the previous steps to be too distant, and can remove the points beyond that point that is closest to the end or start of the other segment in the pair.

Figure 1C:
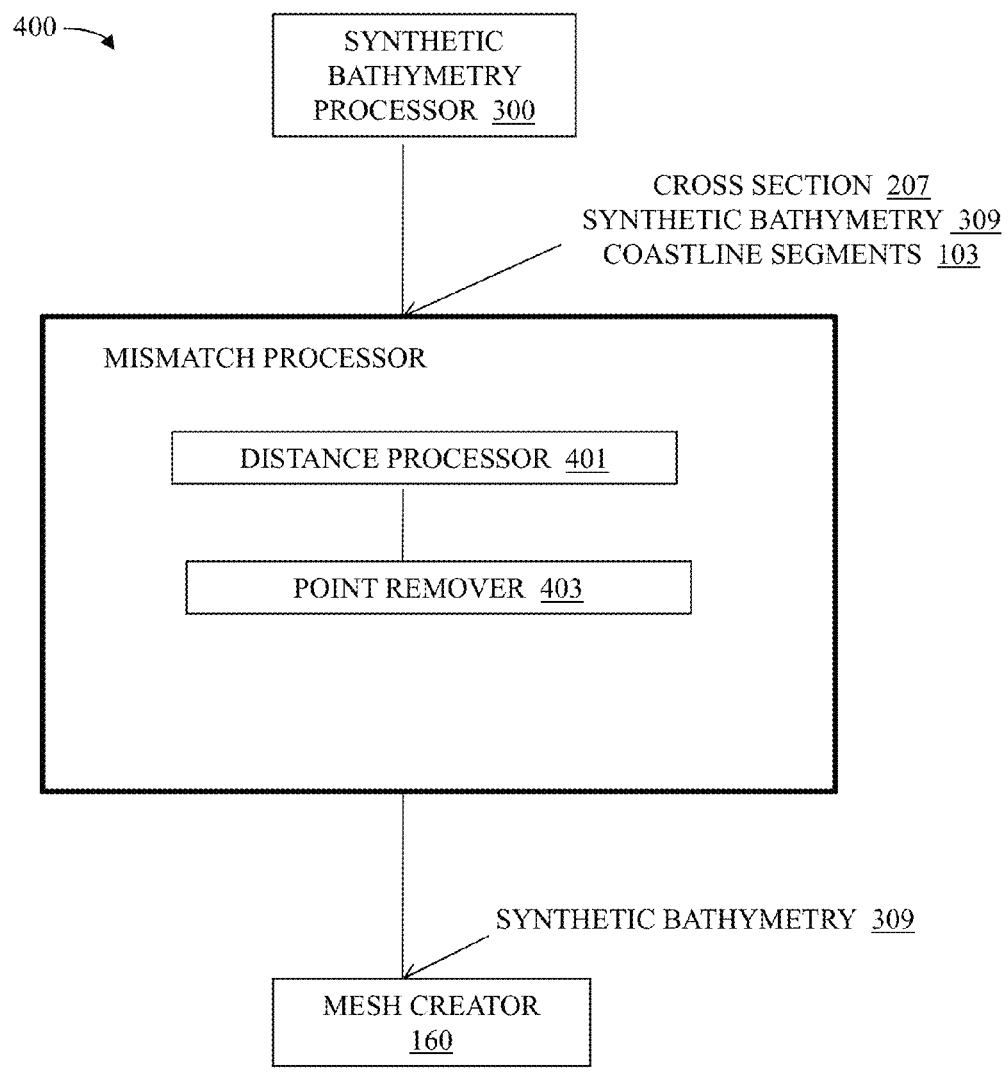
FIG. 1C is a schematic block diagram of the mismatch processor.

Referring now to FIG. 1C, mismatch processor 400 can include, but is not limited to including, for each pair of coastline segments 103 that includes the end of the present segment and the start of the next segment, distance processor 401 for determining the distance between these two points and the end points of the nearest cross section 207. Distance processor 401 can identify any distances found previously that exceed the mean cross section length, and can loop over any excessive distances found previously. For each pair of segment end and start, point remover 403 can remove points from that segment with the start or end that was found in the previous steps to be too distant, and can remove the points beyond that point that is closest to the end or start of the other segment in the pair.

Continuing to refer to FIG. 1, when processing arbitrary imagery to extract coastline position data, the head and mouth of a river may extend outside of the imagery. Similarly, the heads of any tributaries could extend outside of the imagery. In such situations, the river coastline data for these river stretches can end at the image edges. During initial coastline processing, these coastline segments are not combined into longer segments, i.e., a segment end at an image edge is not connected with the opposing side of the river. This situation can lead to a river segment that is "open," or can have a gap in which no coastline points exist. Yet another step in initiating a river model from available imagery is to fill such gaps with coastline points so that the finite element mesh can be initially uniformly generated. Gap fill processor 500 can process open segment ends by looping over all coastline segments, identifying the matching starts and ends of each segment and the next, locating the point at which an end is excessively distant from its nearest neighbor segment start (i.e., a gap exists), and creating a set of equidistant points within the gap. The method of gap fill processor 500 can loop over all coastline segments. For each pair including the end of the present segment and the start of the next segment, the method of gap fill processor 500 can determine the gap distance between these two points and the average spacing between the points of both segments. If the gap distance is greater than or equal to twice the mean of the average spacing of the two segments, then the gap can be filled with points with spacing equal to the average spacing of the two segments. The new points can be flagged as normal flux boundary points. After the imagery-derived land/water edge data have been processed to the final product of an ordered coastline, coastline editor 560 can receive edits to the coastline before the finite element mesh is generated. Anomalous coastline features that remain after previous processing can be removed or modified prior to generation of the mesh. Additionally, gaps can be filled, coastline points can be added or removed, segments can be split, unconnected segments can be joined, and channels can be extended.

Figure 1D:
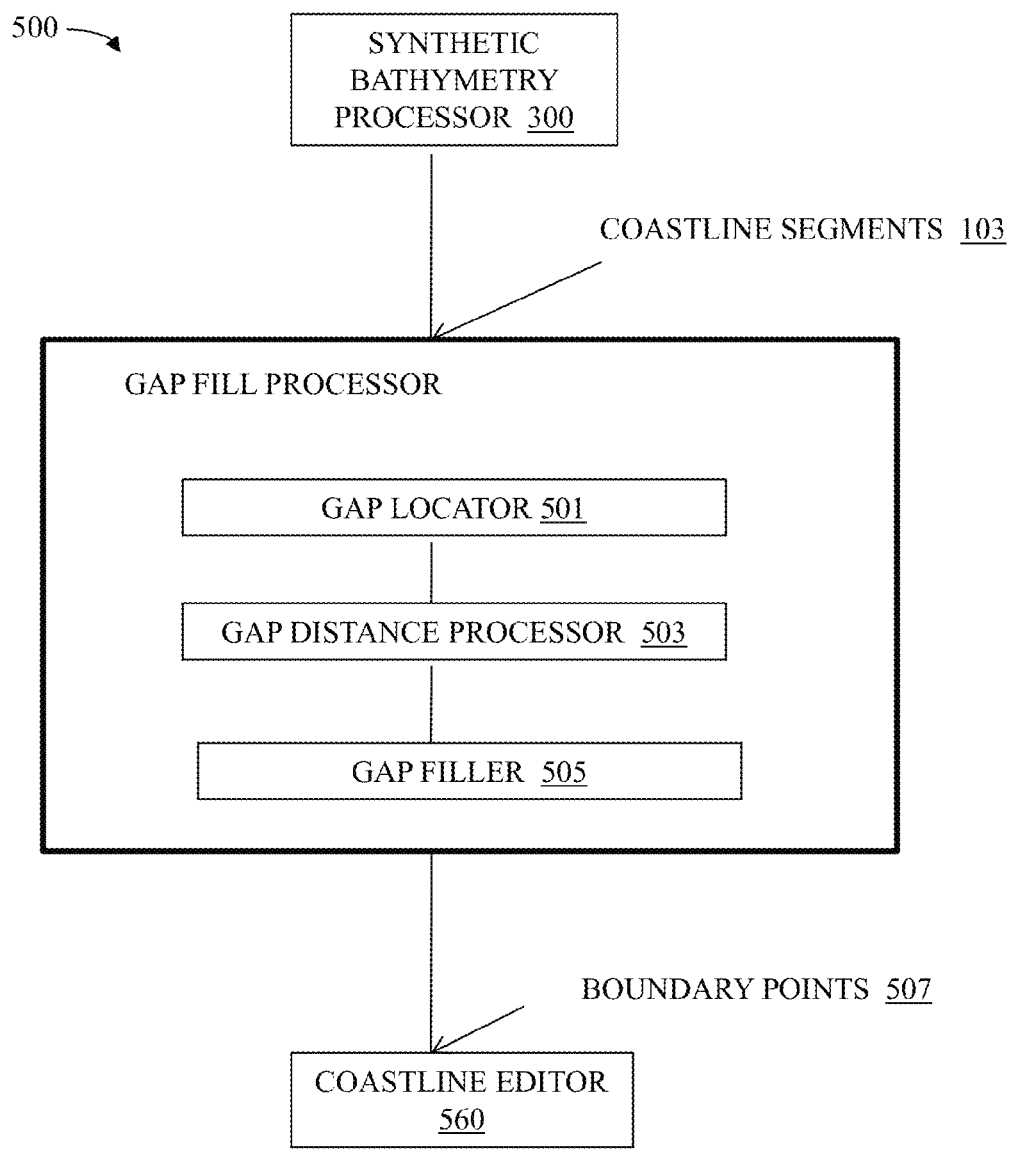
FIG. 1D is a schematic block diagram of the gap fill processor.

Referring now to FIG. 1D, gap fill processor 500 can include, but is not limited to including, gap locator 501 for identifying, from coastline segments 103, the matching starts and ends of each segment 103 and the next, and gap distance processor 503 for determining the gap distance between these two points and the average spacing between the points of both segments. If the gap distance is greater than or equal to twice the mean of the average spacing of the two segments, gap filler 505 can fill the gap with points with spacing equal to the average spacing of the two segments. Gap filler 505 can flag the new points as normal flux boundary points 507 and provide them to coastline editor 560 which can receive edits to the coastline before the finite element mesh is generated. Coastline editor 560 can enable removal and/or modification of anomalous coastline features that remain after previous processing and prior to generation of the mesh. Additionally, coastline editor 560 can enable gaps to be filled, coastline points to be added or removed, coastline segments 103 to be split, unconnected coastline segments 103 to be joined, and channels to be extended.

Continuing to refer to FIG. 1, certain model forcing options may require the addition of an extension to a river channel to prevent undesirable numerical features (e.g., reflection of a tidal wave from a shoreline at the upstream end of the channel) from contaminating the model results. It is advantageous to add such an extension prior to generation of the finite element mesh. River extension processor 460 can enable the addition of an extension that can be added during coastline editing. The length of the extension can be sufficient to dampen the tidal wave during its two-way traversal of the extension. River extension processor 460 can recommend an estimated minimum length of the extension from the mean bathymetric depth as follows, for example. If the tide propagates up river as a shallow water wave, then c=$\sqrt{gh}$. If the dissipation of tidal energy in a shallow coastal plain estuary is on the order of 0.5-4 W/m$^2$, $$D = \langle \rho C_d |U^2|^{\frac{3}{2}} \rangle$$

where D is the dissipation rate and the brackets indicate a tidal average, or dissipation varies linearly with the drag coefficient. If the global average energy density of the tides is 4×10$^3$ J/m$^2$, then DL=Ec, where L is the channel length over which the tide is dissipated and both sides have units of W/m. Rearranging and substituting, $$L = \frac{E}{D}\sqrt{gh}.$$

Assuming a depth of 3 m and taking a low value for D of 0.5 W/m$^2$ (appropriate if a model only accounts for bed friction) then the channel length is approximately 43 km. River extension processor 460 can receive starting points of the extension on opposite sides of the river channel, and can calculate the direction of the extension based on the average direction of the last three points of each side of the channel. River extension processor 460 can determine the remote end points of the extension using, for example, a forward geodetic calculation. River extension processor 460 can calculate the number of new coastline points along each side of the extension based on the average spacing of the opposite coastline segments at the extension starting points and the distance from the starting points to the end points. River extension processor 460 can generate the new coastline points along the opposite sides of the extension so that they are equidistant, for example. River extension processor 460 can connect the remote end points of the extension with a set of equidistant points in the same manner, except that the forward geodetic calculation is not necessary. River extension processor 460 can automatically generate synthetic bathymetry for the extension. The bathymetry calculation algorithm that was previously received can default, for example, to the cube root algorithm if measured bathymetric data is used for generation of the mesh. The newly calculated coastline points along the sides of the extension can be used for the channel cross sections when calculating bathymetry within the extension.

Figure 1E:
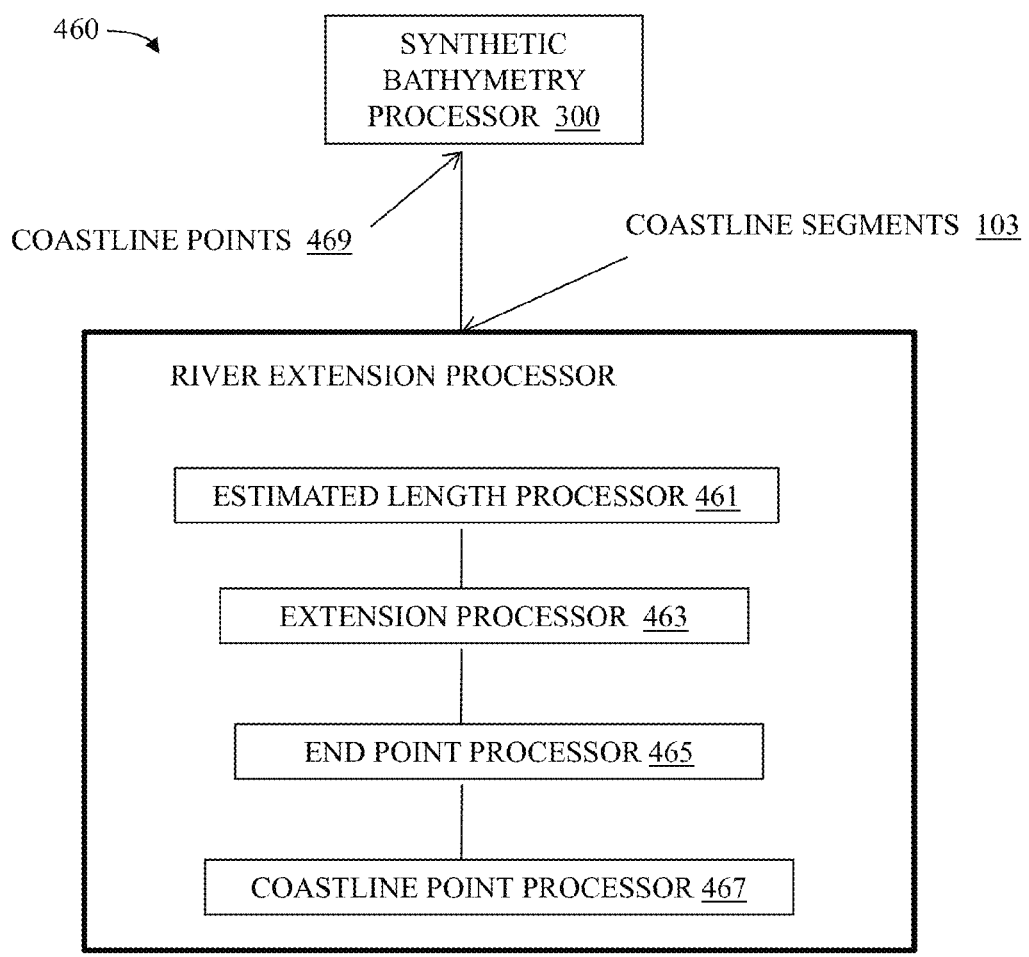
FIG. 1E is a schematic block diagram of the river extension processor.

Referring now to FIG. 1E, river extension processor 460 can include, but is not limited to including, estimated length processor 461 for recommending an estimated minimum channel length of the extension. Estimated length processor 461 can, for example, compute a recommended channel length based on the tide propagation, the dissipation of tidal energy, the global average energy density of the tides, and the channel length over which the tide is dissipated. Extension processor 463 can receive starting points of the extension on opposite sides of the river channel, and can calculate the direction of the extension based on the average direction of the last three points of each side of the channel. End point processor 465 can determine the remote end points of the extension using, for example, a forward geodetic calculation. Coastline point processor 467 can calculate the number of new coastline points 469 along each side of the extension based on the average spacing of the opposite coastline segments at the extension starting points and the distance from the starting points to the end points. Coastline point processor 467 can generate the new coastline points 469 along the opposite sides of the extension so that they are equidistant, for example. Coastline point processor 467 can optionally connect the remote end points of the extension with a set of equidistant points in the same manner, except that the forward geodetic calculation is not necessary. Coastline point processor 467 can automatically generate synthetic bathymetry for the extension. The bathymetry calculation algorithm that was previously received can default, for example, to the cube root algorithm if measured bathymetric data is used for generation of the mesh. The newly calculated coastline points 469 along the sides of the extension can be used for the channel cross sections when calculating bathymetry within the extension.

Continuing to refer to FIG. 1, after the coastline and bathymetry data have been processed and a finite element mesh has been generated, boundary node receiver 260 can receive the specification of boundary nodes, possibly interactively, at which the forcing is applied. The nodes can include, but are not limited to including, one or more boundary segments at the ends of river channels or tributaries, away from the edge of the imagery, which had not been automatically identified as forcing boundary segments. Boundary nodes can be defined by the vertices of a polygon surrounding the region of interest (ROI) that can be interactively received, for example. Boundary node receiver 260 can determine which boundary nodes are within the ROI, and create a list of these. Boundary node receiver 260 can further determine which coastline points are within the ROI, and create a new coastline segment containing these points within coastline coordinate arrays. Boundary node receiver 260 can modify a boundary type array for the coastline points within the ROI to indicate that these points correspond to an open boundary for either tidal elevation or normal flux forcing.

Continuing to refer to FIG. 1, boundary parameter receiver 360 can receive boundary forcing parameters, possibly interactively, at the boundary segments where the forcing is applied, modified, and stored. A GUI or other means can be used for specifying the type of forcing at each boundary forcing segment from among, for example, but not limited to, river discharge, river stage, and tidal elevation. Boundary parameter receiver 360 can enable boundary forcing parameters to be modified for each automatically identified forcing boundary by looping through the identified boundary forcing segments, the boundary forcing identifier having been previously stored in a program data structure by boundary node receiver 260 and gap fill processor 500, and enabling the selection of the type of forcing from among river discharge, river stage, and tidal elevation. For river discharge and river stage, input files or constant values can be specified. For tidal elevation, tidal constituent database, available constituents, and date and time parameters can be specified.

Continuing still to refer to FIG. 1, input file generator 660 can automatically create a complete set of model parameter and input data files based on user-specified parameters and boundary forcing values. This set of files can include, but is not limited to including, a required grid and boundary information file, a required model parameter and periodic boundary condition file, an optional nodal attributes file, an optional non-periodic elevation boundary condition file, an optional non-periodic normal flux boundary condition file, and an optional spatially varying friction coefficient file. The grid and boundary information file includes the finite element mesh received from the mesh creator 160 and the boundary forcing nodal information from the boundary node receiver 260. The model parameter and periodic boundary condition file includes automated or user input from the RST GUI and from the boundary parameter receiver 360 for the case of tidal elevation boundary forcing. The nodal attributes file or the spatially varying friction coefficient file are generated based on automated or user input from the RST GUI, and only one of these files is generated based on the version of the ocean model automatically received from the RST GUI. The non-periodic elevation boundary condition file is generated from the boundary parameter receiver 360 for the case of river stage forcing. The non-periodic normal flux boundary condition file is generated from the boundary parameter receiver 360 for the case of river discharge forcing.

Continuing to refer to FIG. 1, ensemble processor 600 can automatically create an ensemble, a set of input data files iteratively created while using a single finite element mesh, of model input data files. This set of files can be generated for any of several purposes: to quantify model uncertainty, to investigate the sensitivity of the model to variations in one or more input parameters or forcings, and/or to model a variety of scenarios by varying in a sequential manner a single parameter or multiple parameters. Ensemble processor 600 can receive the number of model runs for the ensemble and changes to the model inputs during each iteration through the specified number of runs in the ensemble. The method of ensemble processor 600 can include, but is not limited to including, the steps of receiving information about the ensemble, for example, the number of iterations in the ensemble and whether or not this is a currently-existing ensemble or a new ensemble, and using that information to create run files and, if necessary, perform mesh generation. The method can further include the steps of copying all initially generated parameter and model input files, except a model parameter file and boundary forcing files, to a new set of files with a special file label, for example, an "_ENSNN" file label, where NN is "02" or greater. The method can include the step of issuing a status message in, for example, but not limited to, a pop-up window, to notify the user that the iteration has finished. The method can further include the steps of receiving changes to selected parameters and ignoring other changes to parameters. During the second and subsequent iterations of an ensemble run, coastline processing and mesh generation procedures are not invoked. The method can include the step of copying the coastline, bathymetry, and other data files, and the mesh generated during the initial run to new files with file labels as indicated above. The method can include the step of using the mesh generated during the initial iteration for the second and subsequent iterations. The method can further include the step of setting new boundary forcing nodes and boundary forcing parameters from either newly-received information, if possible, or previously-used information. The method can further include the step of naming and copying the files, and receiving changes to selected parameters, for the received number of iterations. The method can include the step of providing all necessary information to the input file generator 660 for the creation of a complete set of model parameter and input data files for the present ensemble. The method can include the step of continuing iterating from a paused point by receiving a file name that identifies the ensemble.

Figure 2:
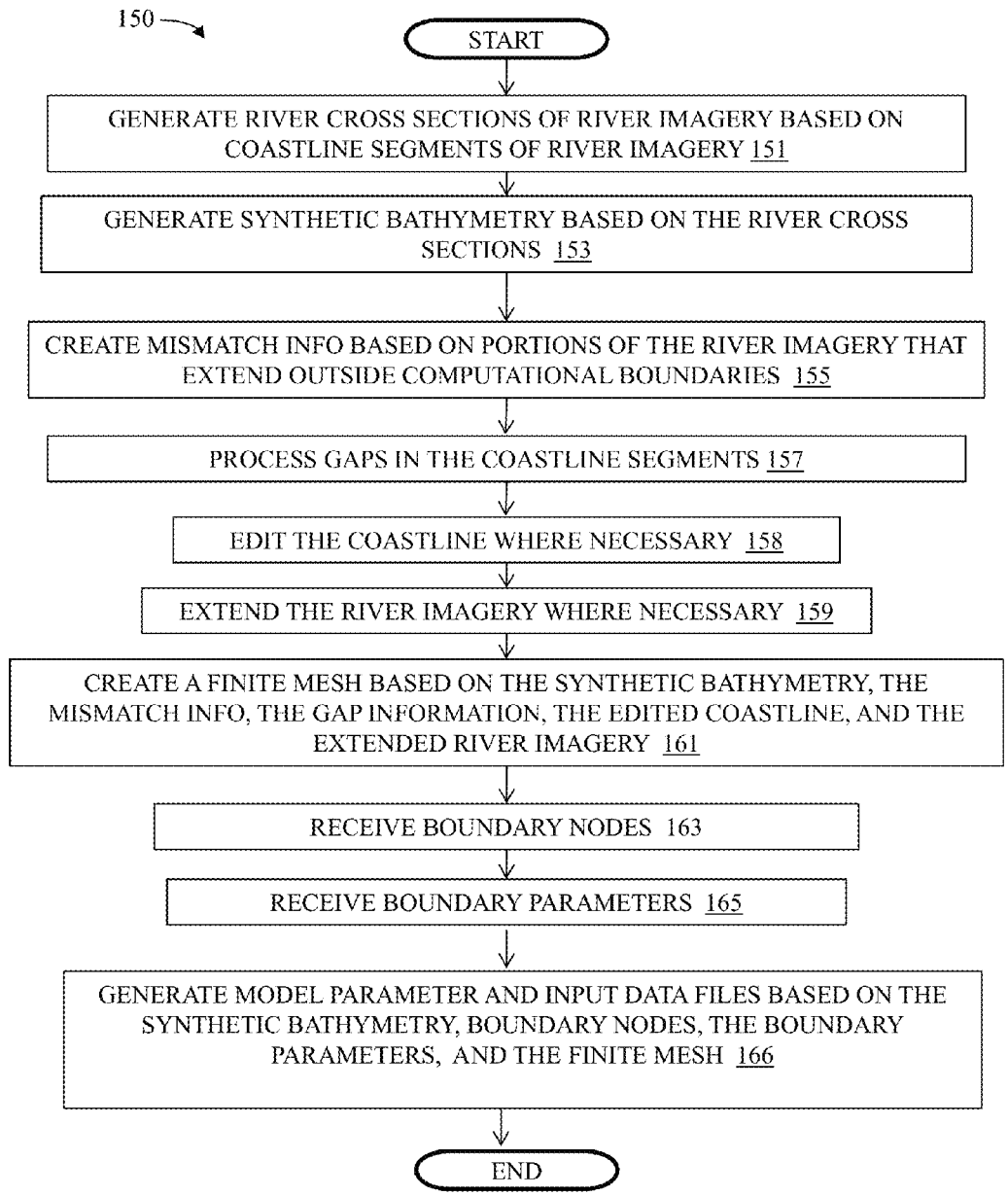
FIG. 2 is a flowchart of the method for simulating river data of the present teachings.

Referring now to FIG. 2, method 150 for creating simulated river data can include, but is not limited to including, the steps of generating river coastline segments based on river imagery, the river imagery having water location points and river boundaries, the river boundaries including coastline location points; generating 151 river cross sections based on the river coastline segments, generating 153 synthetic bathymetry from the river cross sections, correcting 155 portions of the river imagery that extend outside computational boundaries (mismatches), correcting 157 gaps in the coastline segments to generate gap information, editing 158 the coastline where necessary, extending 159 the river imagery where necessary, creating 161 a finite element mesh based on the river cross sections, the mismatches, the gap information, the edited coastline, and the river extension, receiving 163 boundary nodes, receiving 165 boundary parameters, generating 166 model parameter and input data files based on the synthetic bathymetery, the finite element mesh, the boundary nodes, the boundary parameters. Method 150 can optionally include the steps of creating an ensemble of model runs and executing the ensemble.

Figure 3:
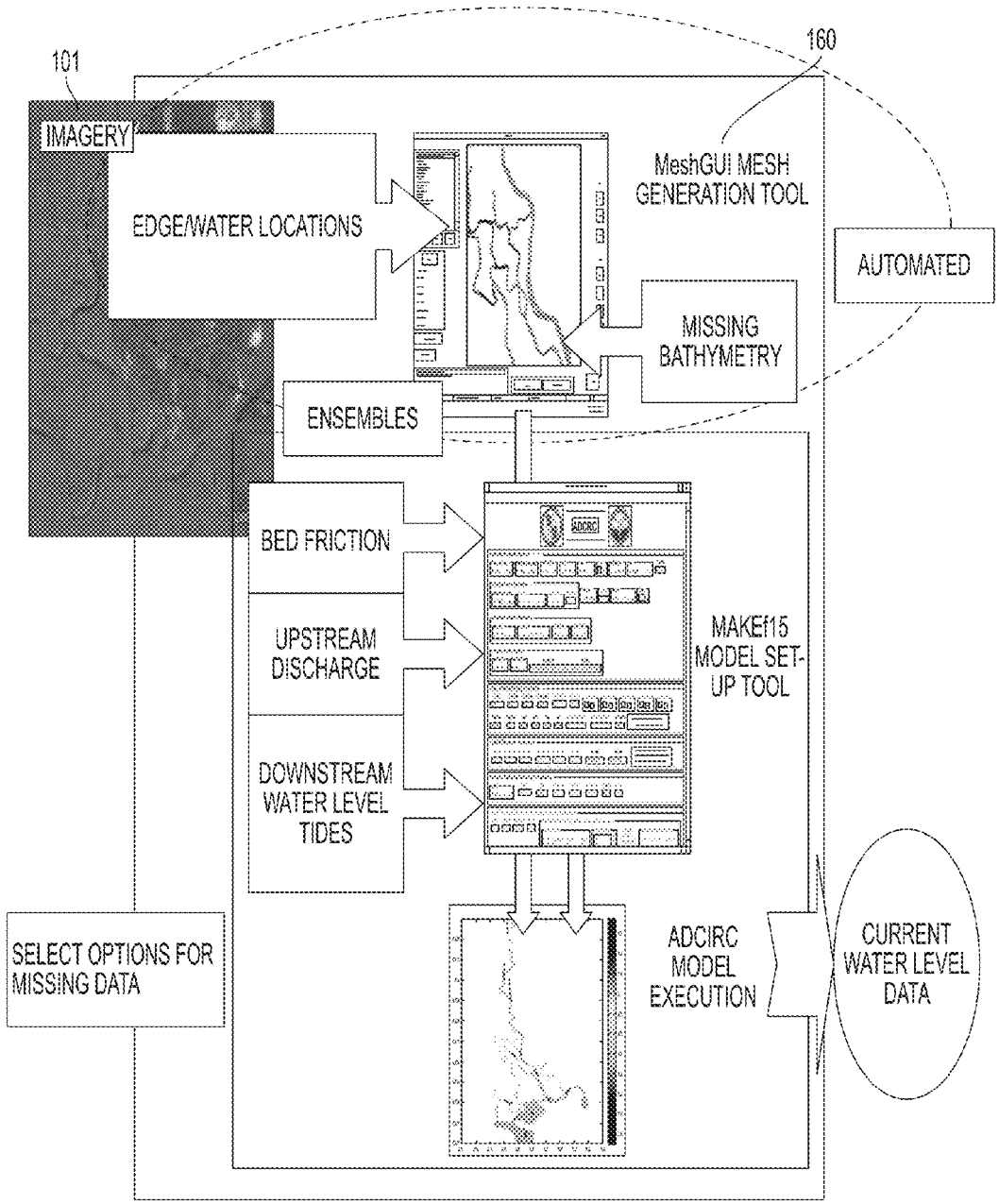
FIG. 3 is a schematic block diagram of the environment in which the system of the present teachings executes.

Referring now to FIG. 3, an illustrative embodiment of feature extraction and simulation of river dynamics using imagery-derived information is shown in which the aspects of river simulation that have been automated by the system and method of the present teachings are circled.

Figure 4A:
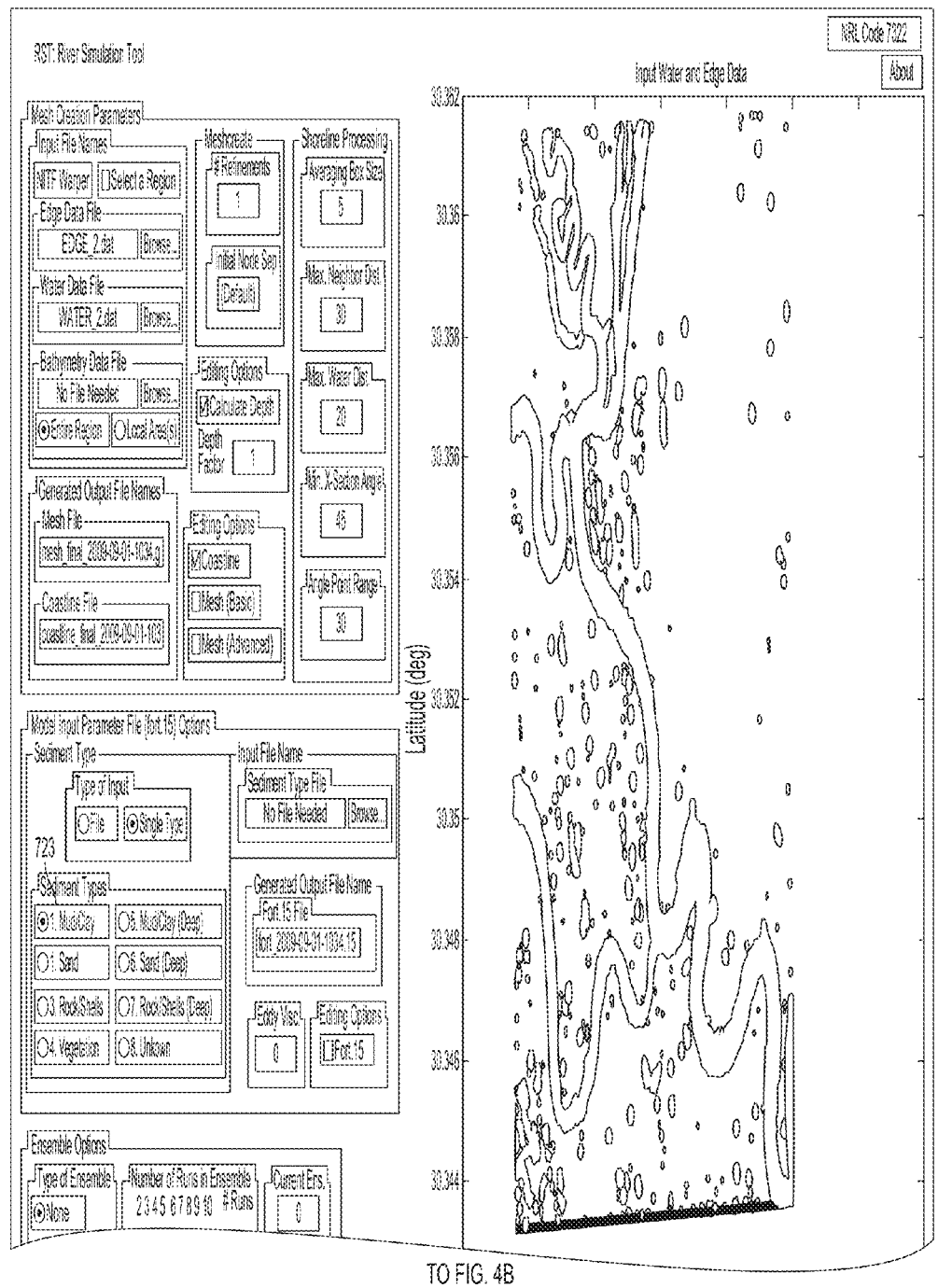
FIGS. 4A-4B provide an exemplary embodiment of the system of the present teachings.
Figure 4B:
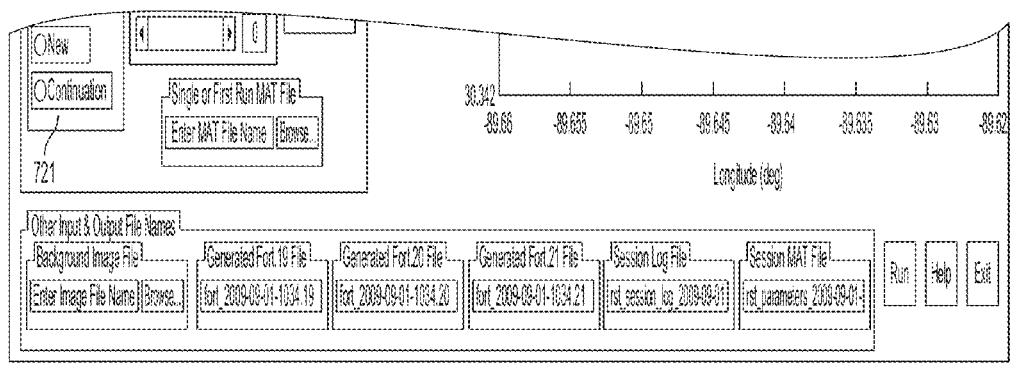

Referring now to FIGS. 4A-4B, in the illustrative embodiment, the system and method of the present teachings can be embodied in a river simulation tool (RST) that can be MATLAB®-based software that provides an interface for configuring a 2D hydrodynamic model of a river or river segment that has been remotely observed and recorded in imagery data. The RST contains automated shoreline processing and mesh generation capabilities for unstructured grids and accommodates user-specified forcing and parameter values. Alternatively, the RST provides synthetic bathymetry and default forcing and parameter values for those situations in which observational data or information describing the river environment is unavailable. RST allows the configuration of a 2D hydrodynamic river model based on imagery-extracted information that defines model geometry and water depth, as available.

Referring now to FIGS. 3, 4A, and 4B, once a single model run is configured, the user can perturb various values of the specified parameters or forcings to generate a set of differing model runs or ensembles of runs. The configuration of an ensemble of model runs is desirable for assessing sensitivities of the predicted currents and water levels to typically unknown parameters and for providing an estimate of uncertainty in the river predictions. Within the RST (see the GUI in FIGS. 4A-4B), ensemble GUI 721 (FIG. 4B) can enable the user can indicate whether a new ensemble is desired, the total number of ensemble members, and the base input (or first run) data. The RST can load the first run data which is the basis for all ensemble perturbations. During the process, the RST indicates to the user which ensemble member is being configured. For all ensemble members the mesh and bathymetry remain fixed. The river simulation system of the present teachings can provide the user with flexibility to specify file names that can serve as required input for a model simulation or that can satisfy other user needs. At the same time the RST maintains default configurations for the model and contingencies to specify missing information, as necessary, such as upstream forcing or bathymetry. Water depth values can be received from, for example, a file in the format of longitude and latitude coordinate pairs with an associated depth value over the entire region defined by the shoreline boundary or in a localized area contained within the river domain. If bathymetry is unknown anywhere or everywhere within the define shoreline, synthetic bathymetric profiles can be used to assign water depths throughout the domain. The synthetic profiles can be constructed using a parabolic functional variation, in which the slope and depth of the profile can be controlled by specification of a multiplicative depth factor. The RST includes a capability for configuring multiple input specifications because there is a great deal of uncertainty when applying the RST to a real river. From these multiple data sets an ensemble of model runs can be performed that bracket the uncertainty or assess the sensitivity of predictions to unknown inputs. Execution of the river model is performed external to the RST software package as the domain size and model execution time can become, but isn't limited to becoming, sufficiently great to require workstation cluster, or even supercomputer, resources. The RST produces model files in formats that directly interface with an ocean model. The grid generation process produces unstructured meshes composed of linear triangles and the specification of forcing and parameter values are also consistent with the ocean model.

Continuing to refer to FIGS. 4A-4B, the sediment type specification 723 (FIG. 4A) links a selected sediment type to a specified Manning's coefficient. A quadratic bottom drag coefficient is then computed based on the water depth using the Manning's and Darcy-Weisbach equations. An inherent assumption in the exemplary embodiment is that the hydrodynamic simulator is applying a bottom friction parameterization based on the quadratic friction law. The RST interface with the ocean model invokes the quadratic bottom friction parameterization by specifying the variable NOLIBF using a value of one in the appropriate parameter file. A single bottom type applied everywhere or a spatially variable sediment type specification read from a file containing longitude and latitude coordinate pairs and the corresponding sediment type number can be chosen. If sediment type "Unknown" is selected a default quadratic friction parameter value of 0.003 is used throughout the model domain. The RST GUI also supports the activation of lateral mixing within the model via an eddy viscosity formulation. An eddy viscosity coefficient, ESLM, in units of $m^2/s$ can be specified. Typical values can range from 0 to 50 with high-end values applied when very fine grid resolution is present. The default is no lateral mixing or an ESLM value of zero.

Figure 5B:
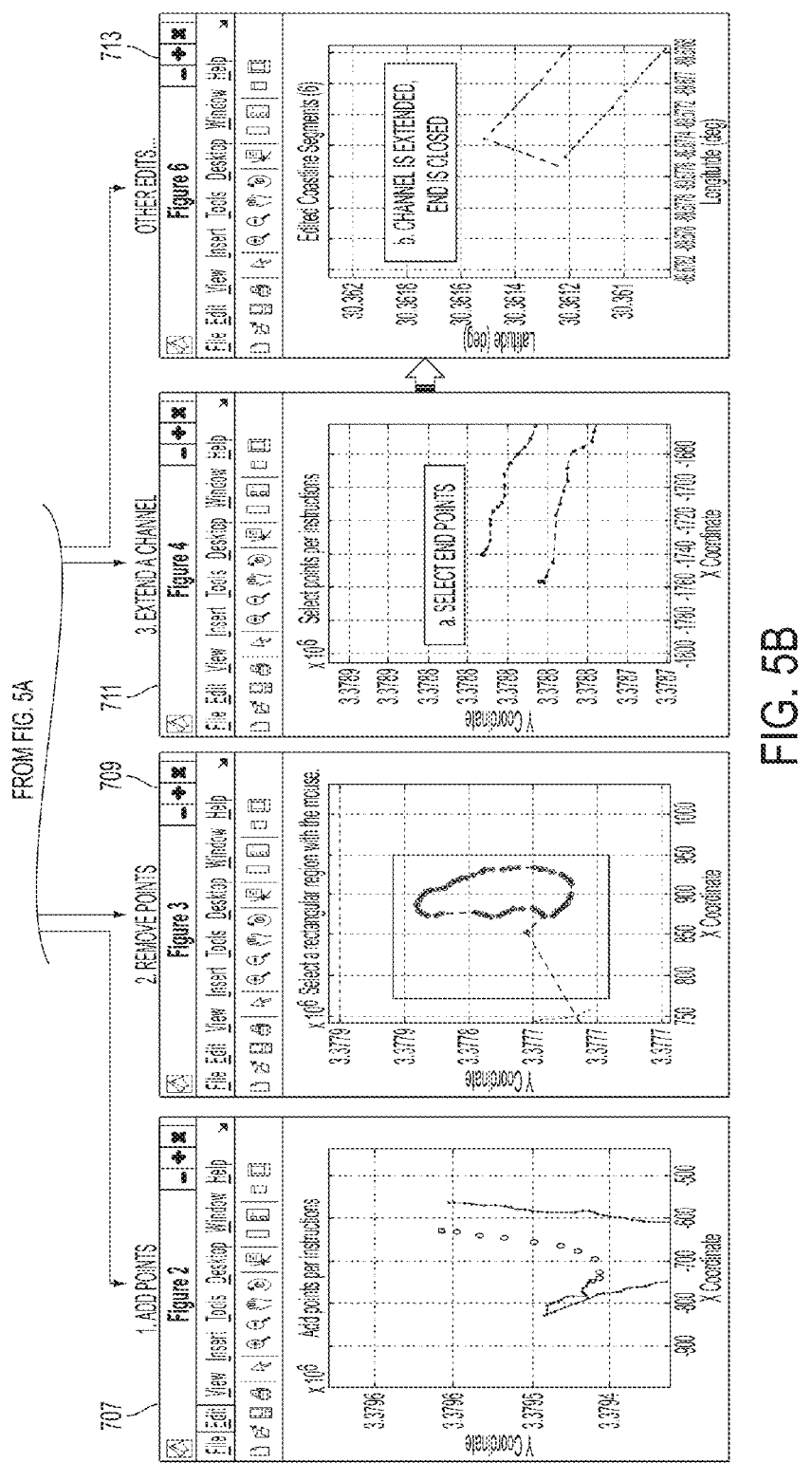

Referring now primarily to FIGS. 5A-5B, the RST can provide for interactive editing of unedited coastline 701 (FIG. 5A) including river shoreline or computational mesh to remove anomalous features not automatically removed during creation of coastline segments 103 (FIG. 1). Editor menu 703 (FIG. 5A) can be provided, for example, to collect user data that might be needed to produce edited coastline 705 (FIG. 5A). Editor menu 703 (FIG. 5A) can include the options of, for example, adding points 707 (FIG. 5B), removing points 709 (FIG. 5B), and extending a channel 711 (FIG. 5B). Extended channel and closed end 713 (FIG. 5B) are the result of these changes to the data. Exemplary interactive editors for modifying the shoreline and mesh are shown in FIGS. 5A-5B.

An edge detection component can extract from the imagery shoreline points that define the river bank. The edge detection component can perform tiled image extraction and can process the edge and water point locations from the imagery data. As an example of use of the present embodiment, input requirements include a browse image that serves as the map to navigate interactive selection of a sub-region. Alternatively the user can input the latitude and longitude limits for a sub-region of interest. Within the selected region, the corresponding image information files are identified. An edge detection algorithm extracts shoreline points that define the river bank from the imagery. Specification of a reduction factor controls the granularity and consequently the number of edge points extracted. Reduction factors with magnitudes less than four increase the number of edge points while values greater than four lead to a decrease in the number of extracted edge points. A slope threshold is defined using a default value of 0.5. Once all input requirements are defined, tiled image extraction is performed to process the edge and water point locations from the imagery. In the plot window on the right hand side of the RST GUI, the extracted water and edge locations are displayed as an overlay on the imagery within the region of interest.

Generation of an unstructured finite element computational mesh can require a closed shoreline and bathymetry values. An ordered, oriented shoreline can be obtained from the edge and water point data extracted from imagery. Default values for the five parameters controlling edge and water data processing are given as: the averaging box size (5 m), maximum neighbor distance (30 m), maximum water point distance (25 m), maximum cross-section angle (45°), and angle point range (30 points). The RST automatically removes spurious segments and mismatched segment ends from the shoreline data. Furthermore, open-ended shoreline pairs are automatically closed with straight-line segments.

Figure 6:
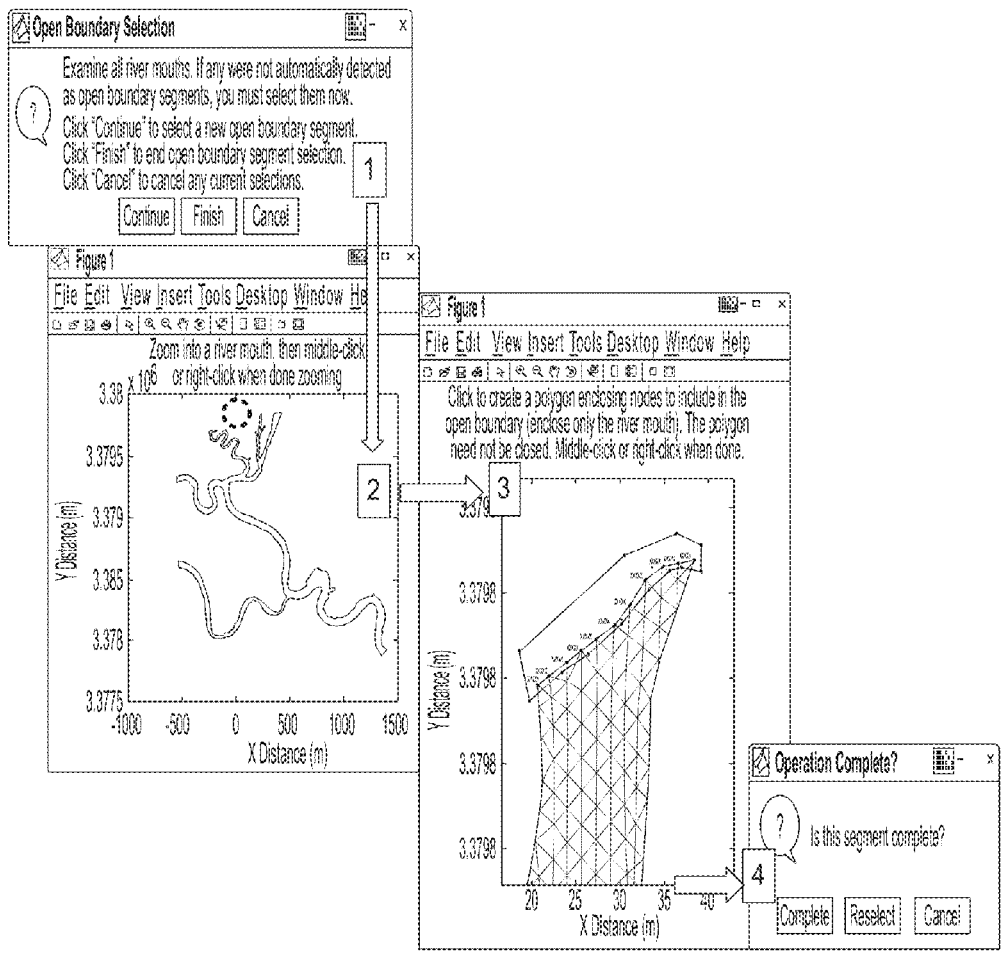
FIG. 6 is a series of charts provided by the GUI of the present teachings for providing boundary forcing nodes.

Referring now to FIG. 6, the closure of boundary segments can be imperfect due to the complexity and highly variable nature of river geometry, so any end-members of the shoreline that are closed (all shoreline data must form a closed loop) but not flagged as forcing segments can be identified interactively using, for example, a four-step process. FIG. 6 indicates an exemplary way to provide to the system boundary points 507.

Figure 7:
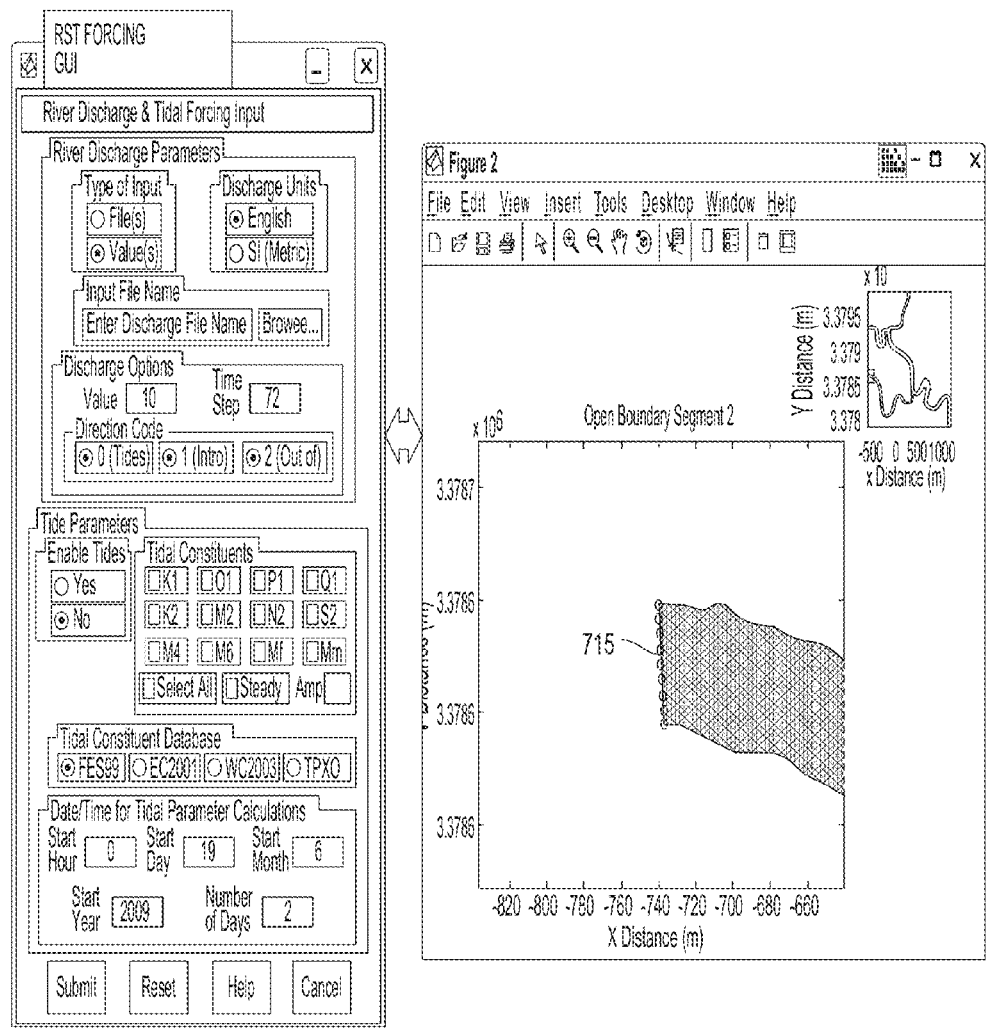
FIG. 7 is a series of charts provided by the GUI of the present teachings for providing forcing data.

Referring now to FIG. 7, after a valid mesh is created, the RST can automatically request and receive boundary forcing, specified flux, or specified elevation. The GUI can step the user through each open boundary with a locator map in the upper right-hand corner of the GUI displaying the current boundary location relative to the entire finite element mesh and a zoomed view of the boundary. Straight-line segments flagged as boundary forcing segments 715 (e.g., named river mouths) can be interactively processed to apply boundary forcing values. Options for flux and elevation forcing include a single specified value or time-varying values received from, for example, a file. The user, for example, can select appropriate units for the specified forcing and a time interval between records in the data. The direction of the flux is also selected. The directional convention is positive for flux into the domain. The specification of tidal elevation is also an option. Tides can be assigned by constituent using any combination of the available constituents extracted from pre-computed tidal databases. Available databases can include global databases, e.g. the FES2004 and the TPXO, and US-based databases, e.g. one for the north-western Atlantic Ocean and one for the eastern-north Pacific Ocean. For tidal forcing the date (hour, day, month, and year) at the start of the tidal time series and the length of the desired time series can be provided. Alternatively, a constant water level stage can be specified or a time-varying stage can be read in from a file. The RST configures the appropriate elevation time series and/or the flux-specified time series ocean model forcing files based on the user selections.

Continuing to refer to FIG. 7, the user can use the GUI of the illustrative embodiment to zoom in to any portion of the boundary and select nodes that will form the open boundary. The user can enclose the desired open boundary nodes with the mouse by clicking on the vertices of a polygon to surround the boundary nodes. This is performed for as many boundary segments as needed. User-specified open boundary segments that are flagged as forcing segments can require the specification of forcing data at a later point. End-members of the shoreline data may still remain "open" or unclosed. For these cases the editing options can be activated for either the coastline or the mesh to remove small portions of an open segment which can then be closed by the RST software. If the RST GUI successfully flags all open boundaries, then this step can be skipped altogether.

Figure 8:
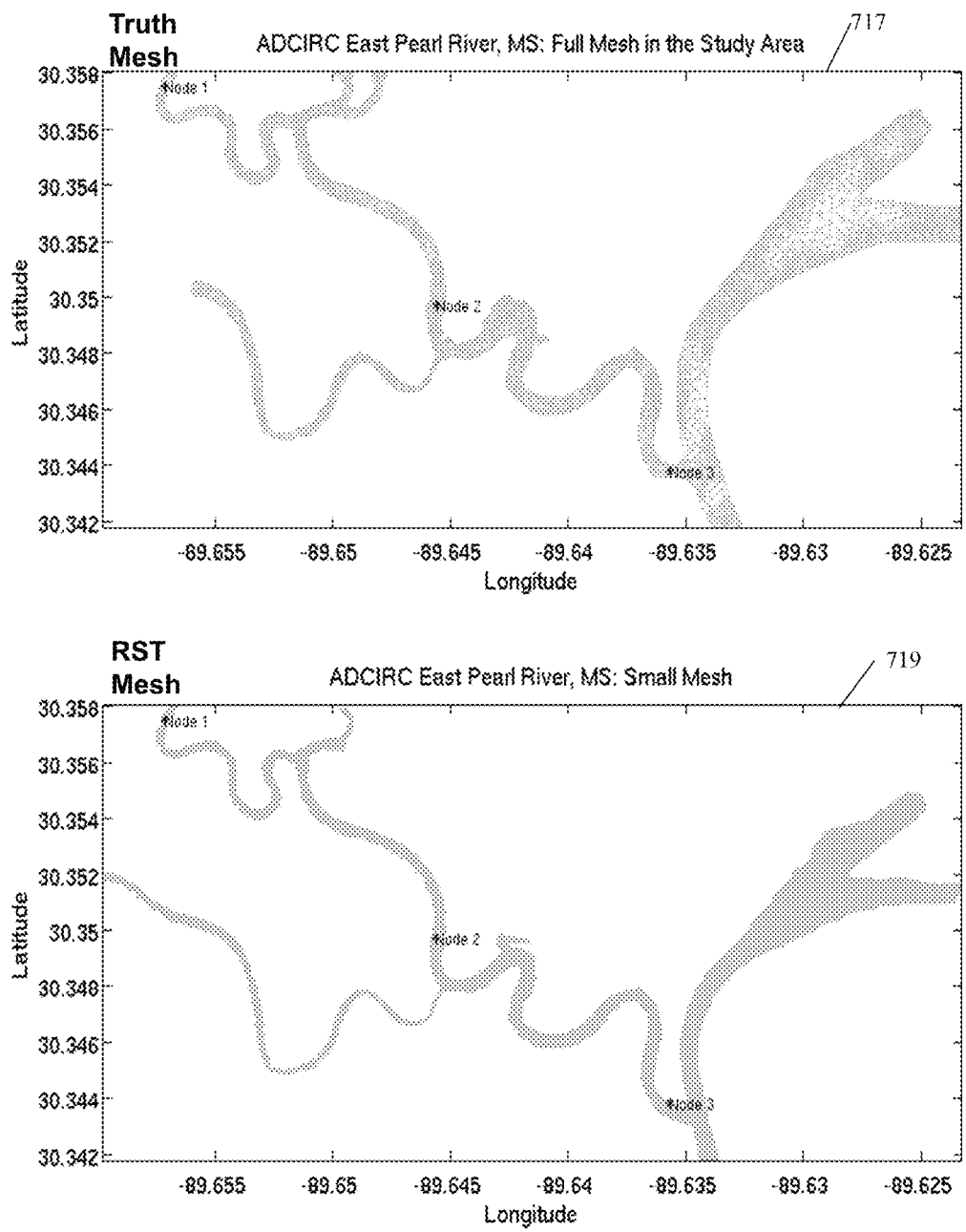
FIG. 8 depicts a finite element mesh and points at which model data were validated for each of truth data and data derived according to an embodiment of the present teachings.

Referring now to FIG. 8, examples of study areas are shown. Upper area 717, labeled, "Truth Mesh," was generated using non-imagery-based methods. Lower mesh 719, labeled, "RST Mesh," was generated using the RST imagery-based method of the exemplary embodiment of the present teachings. Once the shoreline is defined and water depths are identified within the boundary of the shoreline data, generation of a mesh can take place. The automated mesh generation is achieved using an unstructured triangular mesh generator using depth-based refinement criteria. Default values for the mesh generation parameters are set for an initial nodal separation of 10 m with one refinement. The sinuous nature of river geometry and the presence of narrow channels dictates the required mesh resolution rather than the value of the water depths. Thus a fine initial nodal spacing is specified and the number of refinements can be limited to retain a computationally practical problem. The RST grid generation function produces the nodal coordinate list and element incidence list indicating nodal connectivity for an unstructured mesh of linear triangles. The format for this file is defined by the ocean model grid file, fort.14. At this point the RST facilitates the interactive identification any open boundary segments that were not identified as such in the shoreline and mesh generation process.

Continuing to refer to FIG. 8, the mesh shown in the lower half of the figure, created by the RST from the Quickbird imagery of May 1, 2007, has 28,300 nodes and 52,471 elements with an average nodal spacing of 5.6 m. Default values are used for the shoreline processing and mesh generation. The mesh shown in the upper half of the figure was generated using more traditional, non-imagery based methods. The most notable differences between the two meshes of the same region are the narrower channels and greater refinement within the RST river model. The presence of shadows in the imagery or timing of the image with low water conditions can both lead to a narrow bias of the channel width. The synthetic bathymetry option is applied using a depth factor of 1.0.

Embodiments of the present teachings can be directed to computer systems for accomplishing the methods discussed in the description herein, and to computer readable media containing programs for accomplishing these methods. The raw data and results can be stored for future retrieval and processing, printed, displayed, transferred to another computer, and/or transferred elsewhere. Communications links can be wired or wireless, for example, using cellular communication systems, military communications systems, and satellite communications systems. In an exemplary embodiment, the software for the system is written in MATLAB®, Fortran and Perl. The system operates on a computer having an arbitrary number of CPUs. Other alternative computer platforms can be used. The operating system can be, for example, but is not limited to, WINDOWS® or LINUX®.

The present embodiment is also directed to software for accomplishing the methods discussed herein, and computer readable media storing software for accomplishing these methods. The various modules described herein can be accomplished on the same CPU, or can be accomplished on a different computer. In compliance with the statute, the present embodiment has been described in language more or less specific as to structural and methodical features. It is to be understood, however, that the present embodiment is not limited to the specific features shown and described, since the means herein disclosed comprise preferred forms of putting the present embodiment into effect.

Referring again to FIG. 2, method 150 can be, in whole or in part, implemented electronically. Signals representing actions taken by elements of system 100 and other disclosed embodiments can travel over at least one live communications network. Control and data information can be electronically executed and stored on at least one computer-readable medium. The system can be implemented to execute on at least one computer node in at least one live communications network. Common forms of at least one computer-readable medium can include, for example, but not be limited to, a floppy disk, a flexible disk, a hard disk, magnetic tape, or any other magnetic medium, a compact disk read only memory or any other optical medium, punched cards, paper tape, or any other physical medium with patterns of holes, a random access memory, a programmable read only memory, and erasable programmable read only memory (EPROM), a Flash EPROM, or any other memory chip or cartridge, or any other medium from which a computer can read. Further, the at least one computer readable medium can contain graphs in any form including, but not limited to, Graphic Interchange Format (GIF), Joint Photographic Experts Group (JPEG), Portable Network Graphics (PNG), Scalable Vector Graphics (SVG), and Tagged Image File Format (TIFF).

Although the present teachings have been described with respect to various embodiments, it should be realized these teachings are also capable of a wide variety of further and other embodiments.

What is claimed as new and desired to be protected by Letters Patent of the United States is:

1. A method for creating simulated river data for a prediction model comprising:
generating river coastline segments based on river imagery, the river imagery having water location points and river boundaries, the river boundaries including coastline location points;
generating river cross sections from the river coastline segments by:
  (a) receiving a current segment identifier identifying a current segment from the river coastline segments based on the current segment identifier, the current segment having a midpoint, and labeling the midpoint as one end of a river cross section associated with the current segment;
  (b) receiving an angle range of an angle in a direction of the river;
  (c) labeling the midpoint of a nearest of the river coastline segments to the current segment within the angle range to the current segment as the other end of the river cross section associated with the current segment;
  (d) deleting the river cross section associated with the current segment if it intersects with another of the river cross sections;
  (e) deleting the river cross section associated with the current segment if it does not span the river;
  (f) restricting the angle range to force the river cross section associated with the current segment to span the river; and
  (g) repeating steps (a)-(f) until all possible of the river cross sections are created throughout a region covered by the river coastline segments and the river cross sections;
generating synthetic bathymetry from the river cross sections;
correcting gaps in the river coastline segments;
creating a finite element mesh based on the river cross sections, corrected portions of the river coastline segments, the corrected gaps, the river coastline segments, and a river extension; and
generating model parameters and input data files based on the synthetic bathymetry, the finite element mesh, boundary nodes, and boundary parameters.

2. The method as in claim 1 further comprising:
correcting portions of the river coastline segments that extend outside imagery boundaries of the river imagery;
editing the river coastline segments if necessary; and
extending a river coastline associated with the river coastline segments and the synthetic bathymetry if necessary.

3. The method as in claim 1 further comprising:
creating an ensemble of the model parameter and input data files; and
executing an ensemble of model runs based on the ensemble of the model input files.

4. The method as in claim 1 wherein said step of generating synthetic bathymetry comprises:
dividing each of the river cross sections into a first half and a second half;
determining a pre-selected number of equidistant points along the first half and the second half;
computing a known point distance from each of the equidistant points to a preselected known point; and
computing an idealized river bathymetry based on applying a computation function to each of the equidistant points at the known point distance.

5. The method as in claim 1 wherein said step of correcting gaps in the river coastline segments comprises:
for each of the river coastline segments, each of the river coastline segments having a distal end and a proximal end, beginning with the proximal end, determining a distance between the proximal end of one of the river coastline segments coincident with the distal end of an adjacent one of the river coastline segments and the river cross section nearest the adjacent one of the river coastline segments;
selecting the river coastline segments between the distal end and the proximal end if the distance is greater than a predetermined river cross section length;
for each of the river coastline segments beginning with the proximal end, determining the distance between the proximal end of one of the river coastline segments and the distal end of an adjacent one of the river coastline segments;
computing a first average distance between a first set of points within the one of the river coastline segments;
computing a second average distance between a second set of points within the adjacent of the river coastline segments;
computing a third average distance between the first average distance and the second average distance; and
inserting a third set of points, with spacing equal to the third average distance, between the proximal end and the distal end if the distance is greater than or equal to twice the third average distance.

6. A computer system having computer code stored on a non-transitory computer readable medium simulating river data comprising:
an automatic mismatch processor executing in a computer, the automatic mismatch processor correcting portions of a river that extend outside river imagery, the river having river boundaries, the river boundaries including coastline segments, the river having river cross sections;

an automatic gap fill processor executing in a computer, the automatic gap fill processor correcting gaps in the coastline segments;

an automatic mesh creator executing in a computer, the automatic mesh creator creating a finite element mesh based on the river cross sections, synthetic bathymetry, the corrected portions of the river, the corrected coastline segments, and a river extension;

an automatic model parameter and input data file generator executing in a computer, the automatic model parameter and input data file generator preparing model parameter and input data in a format specific to an ocean model based on boundary parameters, boundary nodes, the finite element mesh, the river extension, corrected coastline segments, the synthetic bathymetry, and the river cross sections; and an automatic river cross section generator executing in a computer, the automatic river cross section generator generating the river cross sections based on the river, the river being included in the river imagery, the river having the river boundaries, the river boundaries including the coastline segments, wherein the automatic river cross section generator comprises:
a midpoint processor determining midpoints of each said coastline segment derived from said imagery, and determining a nearest location to the location of said midpoint within a pre-selected angular range to said coastline segment, wherein said angular range is directed in the direction of the river;
an intersection processor checking for intersections of said river cross sections between two different of said coastline segments, checking for intersections of said river cross sections when a segment self-connects, and checking for intersections involving three different of said coastline segments; and
a restriction processor restricting said angular range for the self-connections wherein said river cross sections are across the banks of the river;
wherein said river cross sections are provided to an automatic synthetic bathymetry processor.

7. The computer system as in claim 6 further comprising:
the automatic synthetic bathymetry generator executing in a computer, the automatic synthetic bathymetry generator generating the synthetic bathymetry from the river cross sections;
a coastline editor executing in a computer, the coastline editor editing the corrected coastline segments if necessary;
an automatic river extension processor executing in a computer, the automatic river extension processor extending the corrected river if necessary, said river extension processor creating the river extension;
an automatic boundary node receiver executing in a computer, the automatic boundary node receiver receiving the boundary nodes; and
an automatic boundary parameter receiver executing in a computer, the automatic boundary parameter receiver receiving the boundary parameters.

8. The system as in claim 7 wherein said synthetic bathymetry generator comprises:
a cross section divider looping over said river cross sections, at a current of said river cross sections, dividing the current of said river cross sections into two halves;
a point locator locating a pre-selected number of equidistant points along each of the halves and point locator calculating a distance to a pre-selected point;
a depth function processor computing the synthetic bathymetry based on the distance according to a pre-selected algorithm at each of the equidistant points; and
a duplicate point processor eliminating any duplicate points from one of the halves at the center of the current of said river cross sections;
wherein the synthetic bathymetry is provided to said mesh generator.

9. The system as in claim 8 wherein said algorithm is a parabolic method, and wherein said depth function processor computes said pre-selected point as the center of the current of said river cross sections.

10. The system as in claim 8 wherein said algorithm is a cube root method, and wherein said depth function processor identifies said pre-selected point as the coastline end of the current of the half of the river cross section.

11. The system as in claim 8 wherein said gap fill processor comprises:
a gap locator identifying, from said coastline segments, choosing a pair a coastline segments, matching each coastline segment end of each of the coastline segments of said pair of said coastline segments with a coastline segment start of another of said pair of said coastline segments;
a gap distance processor determining a gap distance between the coastline segment end and the coastline segment start, said gap distance processor computing an average spacing between the points of each of said pair of said coastline segments; and
a gap filler filling a gap with filling points having spacing equal to the average spacing if the gap distance is greater than or equal to twice a mean of the average spacing, said gap filler flagging said filling points as normal flux of said boundary points, said gap filler providing said filling points to said coastline editor,
wherein said coastline editor receives edits to the coastline segments before said finite element mesh is generated, said coastline editor enabling removal or modification of anomalous coastline features prior to generation of said finite element mesh, said coastline editor enabling said gaps to be filled, said points to be added or removed, said coastline segments to be split, unconnected of said coastline segments to be joined, and channels to be extended.

12. The system as in claim 7 where said river extension processor comprises:
an estimated length processor recommending an estimated minimum channel length of the river extension;
an extension processor receiving starting points of the river extension on opposite sides of a channel formed by the river, the channel having a tide, said extension processor calculating a river direction of the river extension based on an average direction determined at each side of said channel;
an end point processor determining remote end points of the river extension; and
a coastline point processor calculating a number of coastline points along each side of the river extension based on an average spacing of said coastline points at starting points and the distance from the starting points to the end points, said coastline point processor generating said coastline points along opposite sides of the river extension, said coastline point processor automatically generating said synthetic bathymetry for the river extension.

13. The system as in claim 12 where said estimated length processor computes a recommended channel length based on tide propagation, dissipation of tidal energy, global average energy density of tides, and channel length over which tides are dissipated.

14. The system as in claim 13 wherein said end point processor determines the remote end points based on a forward geodetic calculation.

15. The system as in claim 12 wherein said synthetic bathymetry within the river extension is calculated based on said coastline points along the sides of the river extension and used for channel cross sections.

16. The system as in claim 6 wherein said mismatch processor comprises:
  a distance processor, for each of the coastline segments, wherein each of the coastline segments includes a distal end and a proximal end, beginning with the proximal end, determining a distance between the proximal end of one of the coastline segments coincident with the distal end of an adjacent one of the coastline segments and the river cross section nearest the adjacent one of river coastline segments, identifying and looping over distances that exceed a mean length of said river cross sections; and
  for each pair of said coastline segments, a point remover removing points starting with one of the points that is closest to an end or a start of one of said coastline segments if a pair of the points is a preselected distance from a known point.

17. A non-transitory computer readable medium comprising computer code for providing input to a prediction model, said computer code, when executed by a processor, performing steps comprising:
  generating ordered river coastline segments based on river imagery, the river imagery having water location points and the river boundaries, the river boundaries including coastline location points;
  correcting portions of river coastline segments that extend outside the river boundaries;
  correcting gaps in the river coastline segments;
  editing the river coastline segments if necessary;
  generating the river cross sections from the river coastline segments by:
    (a) receiving a current segment identifier identifying a current segment from the river coastline segments based on the current segment identifier, the current segment having a midpoint, and labeling the midpoint as one end of a river cross section associated with the current segment;
    (b) receiving an angle range of an angle in the direction of the river;
    (c) labeling the midpoint of a nearest of a river coastline segments to the current segment within the angle range to the current segment as the other end of the river cross section associated with the current segment;
    (d) deleting the river cross section associated with the current segment if it intersects with another of the river cross sections;
    (e) deleting the river cross section associated with the current segment if it does not span the river;
    (f) restricting the angle range to force the river cross section associated with the current segment to span the river; and
    (g) repeating steps (a)-(f) until all possible of the river cross sections are created throughout a region covered by the river coastline segments and the river cross sections;
  creating a finite element mesh based on the river cross sections, the corrected portions, the corrected gaps, the river coastline segments, and a river extension;
  generating a synthetic bathymetry from the river cross sections;
  generating model parameters and input data files based on the synthetic bathymetry, the finite element mesh, boundary nodes, and boundary parameters; and
  extending a river coastline associated with the river coastline segments and the synthetic bathymetry if necessary.

* * * * *